US006600652B2

(12) United States Patent
Chandran et al.

(10) Patent No.: US 6,600,652 B2
(45) Date of Patent: Jul. 29, 2003

(54) PACKAGE RETENTION MODULE COUPLED DIRECTLY TO A SOCKET

(75) Inventors: Biju Chandran, Chandler, AZ (US); Carlos A. Gonzalez, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/967,785

(22) Filed: Sep. 28, 2001

(65) Prior Publication Data

US 2003/0063440 A1 Apr. 3, 2003

(51) Int. Cl.7 .................................................. H05K 7/20
(52) U.S. Cl. .................... 361/704; 24/458; 257/719; 361/719
(58) Field of Search ................... 361/704–712, 361/717–719, 722; 165/80.3, 185; 174/16.3; 257/718, 719, 726, 727; 24/459, 458; 248/505, 510

(56) References Cited

U.S. PATENT DOCUMENTS

| 4,547,031 | A | | 10/1985 | Korsunsky | |
|---|---|---|---|---|---|
| 5,448,449 | A | * | 9/1995 | Bright et al. | 361/704 |
| 5,671,118 | A | * | 9/1997 | Blomquist | 361/704 |
| 5,761,036 | A | * | 6/1998 | Hopfer et al. | 361/704 |
| 5,777,852 | A | | 7/1998 | Bell | |
| 5,870,287 | A | * | 2/1999 | Rodriguez et al. | 361/704 |
| 6,175,499 | B1 | * | 1/2001 | Adams et al. | 361/704 |
| 6,249,436 | B1 | * | 6/2001 | Bollesen | 361/720 |
| 6,250,375 | B1 | | 6/2001 | Lee | |
| 6,347,036 | B1 | * | 2/2002 | Yeager et al. | 361/687 |

* cited by examiner

Primary Examiner—Gerald Tolin
(74) Attorney, Agent, or Firm—Pillsbury Winthrop LLP

(57) ABSTRACT

A retention module includes a socket to connect to a package. At least one retention arm is coupled to the socket. At least one clamping bar is coupled to the at least one retention arm to secure placement of a heat sink against a surface of a package assembly.

12 Claims, 5 Drawing Sheets

Package system 200

- Rotation pin 170
- Heat sink 210
- Retention module 100
- Clamping bar 110
- Retention arm 120
- IHS lid 220
- Package 230
- Socket 130
- Socket connector 140
- Motherboard 150

PACKAGE RETENTION MODULE COUPLED DIRECTLY TO A SOCKET

BACKGROUND OF THE INVENTION

1. Field of the Invention

The present invention generally relates to a retention module for retaining a heat sink to a package assembly. More particularly, the present invention relates to a package assembly retention module that is coupled directly to a socket.

2. Discussion of the Related Art

A heat sink is usually placed in contact with an electronic device, such as a Central Processing Unit (CPU), for removing heat therefrom. For higher-power devices, an integrated heat spreader (IHS) lid is generally placed between the heat sink and the electronic device to facilitate cooling the device. The electronic device is often mounted on a socket that couples to the motherboard. Various retention modules have been used for maintaining intimate contact between the heat sink and the IHS lid, or the bare package.

As shown in FIG. 5, a typical retention module is attached to the motherboard 150, often by passing the retention module through a motherboard hole 520 that is drilled into the motherboard 150 outside the perimeter of the socket 130 that couples to the motherboard 150. Drilling motherboard holes 520 takes up valuable space on the motherboard 150, approximately 25–50% more area than the socket 130 alone, thereby increasing the price of the motherboard 150. Furthermore, the area occupied by the motherboard holes 520 is close to a package 230, a space highly desirable to design engineers to place capacitors, voltage regulators, and other electrical components to optimize performance of the package 230. Holes are generally drilled into the heat sink 210 as well, so that the retention module may also pass through the heat sink 210. The heat sink 210 must extend outside the perimeter of the socket 130 that couples to the motherboard 150 to provide sufficient space for the retention module 100 to pass through. Fasteners 530, such as clamps, screws, or nuts, are then coupled to the ends of the retention module to ensure a secure contact between the heat sink 210 and the IHS lid 220 or the package 230. A tool is required to apply the fasteners 530, which makes the assembly procedure more complicated.

Furthermore, having separate retention modules may give rise to inventory issues and increase both the cost of the package system and the number of piece parts. Although typical retention modules may be required to support the large heat sinks generally required in servers, the use of such retention modules may often be unnecessary and add cost in lower-power systems.

Thus, a retention module that requires neither additional motherboard space nor modifications to the motherboard is required.

DETAILED DESCRIPTION

Figure 1:
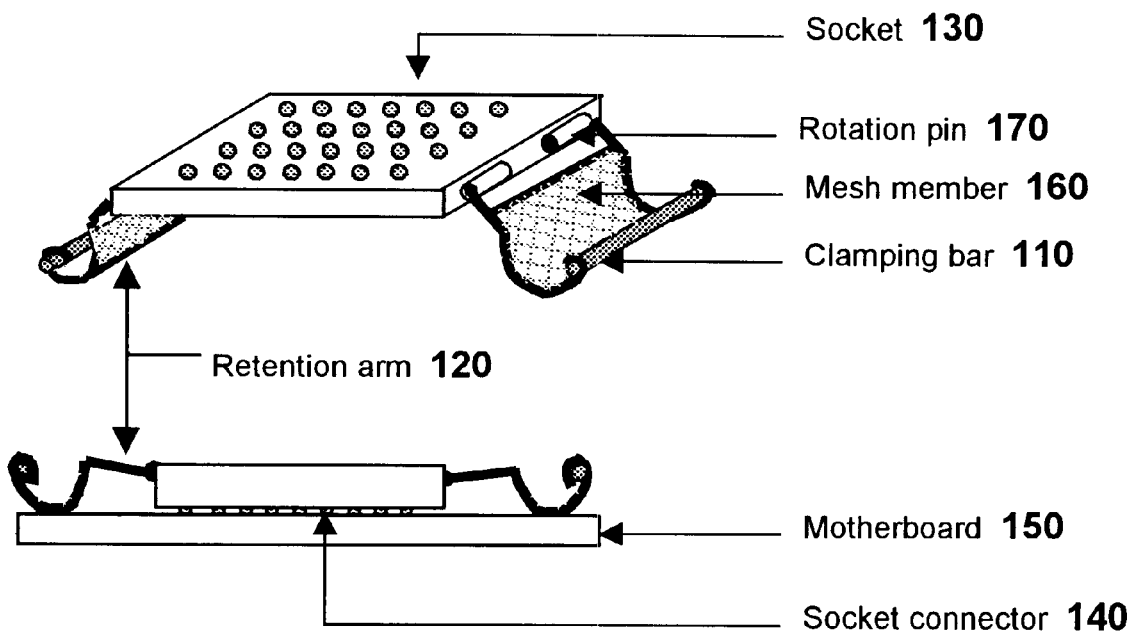
FIG. 1 illustrates a retention module according to an embodiment of the present invention.
Figure 5:
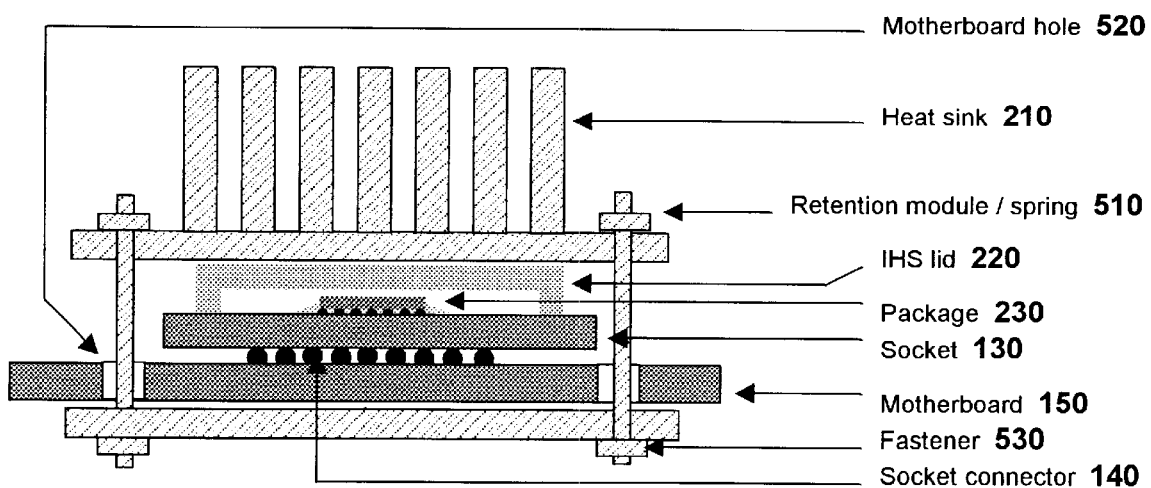
FIG. 5 illustrates a conventional prior art package system.

FIG. 1 illustrates a retention module according to another embodiment of the present invention. The retention module 100 includes a socket 130, at least one retention arm 120, and at least one clamping bar 110. The retention arm 120 is coupled to the socket 130. This is in contrast to the prior art retention module/spring 510 of FIG. 5, which is coupled to the motherboard 150. The socket 130 couples to a socket connector 140 on a motherboard 150. The clamping bar 110 is coupled to the retention arm 120 on the end opposite the socket 130 to secure placement of a heat sink 210 is against a surface of a package assembly. The package assembly may include a package 230 (see FIG. 2) or both an integrated heat spreader (IHS) lid 220 (see FIG. 2) and a package 230.

A second opposing retention arm 120 according to a preferred embodiment of the invention is coupled to the socket 130. The retention arms 120 define a receiving space for receiving a package assembly and a heat sink 210 (see FIG. 2).

In one embodiment of the present invention, the retention arm(s) 120 are rotatably affixed to the socket 130. This is in contrast to the prior art retention module/spring 510 of FIG. 5, which is statically affixed to the motherboard 150. According to another embodiment, a rotation pin 170 rotatably affixes the retention arm(s) 120 to the socket 130. In another embodiment, the retention arm(s) 120 include a mesh member 160, defining a receiving space for receiving a package assembly and a heat sink 210. In another embodiment of the invention, the retention arm(s) 120 are formed of wire. According to yet another embodiment, the socket 130 is plastic.

Figure 2:
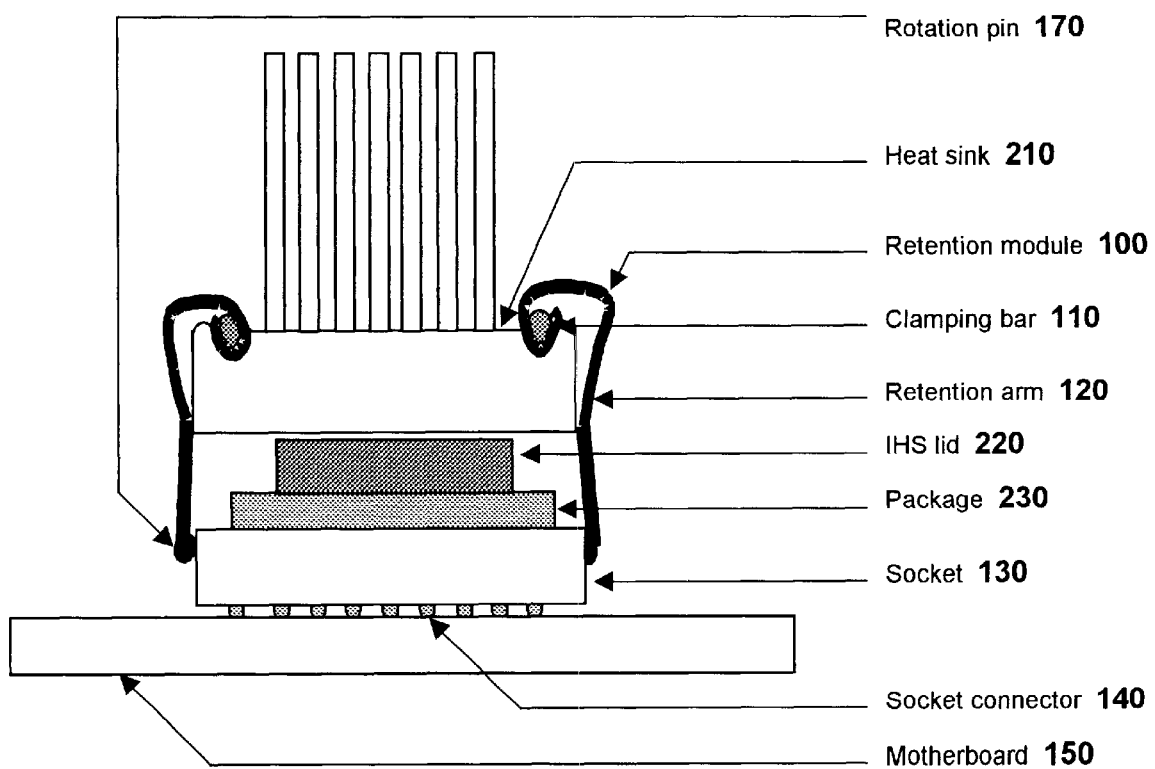
FIG. 2 illustrates a package system according to another embodiment of the present invention.

FIG. 2 illustrates a package system according to an embodiment of the present invention. The package system 200 includes a package assembly and a retention module 100. The package assembly may include a package 230 or both an integrated heat spreader (IHS) lid 220 and a package 230.

The retention module 100 includes a socket 130, at least one retention arm 120, and at least one clamping bar 110. The retention arm 120 is coupled to the socket 130. This is in contrast to the prior art retention module/spring 510 of FIG. 5, which is coupled to the motherboard 150. The socket 130 couples to the motherboard 150 via the socket connector 140. The clamping bar 110 is coupled to the retention arm 120 on the end opposite the socket 130 to secure placement of a heat sink 210 against a surface of a package assembly. The clamping bar 110 secures onto the heat sink 210, a package 230 surface, and/or an IHS lid 220 surface by an engagement fit.

Figure 3:
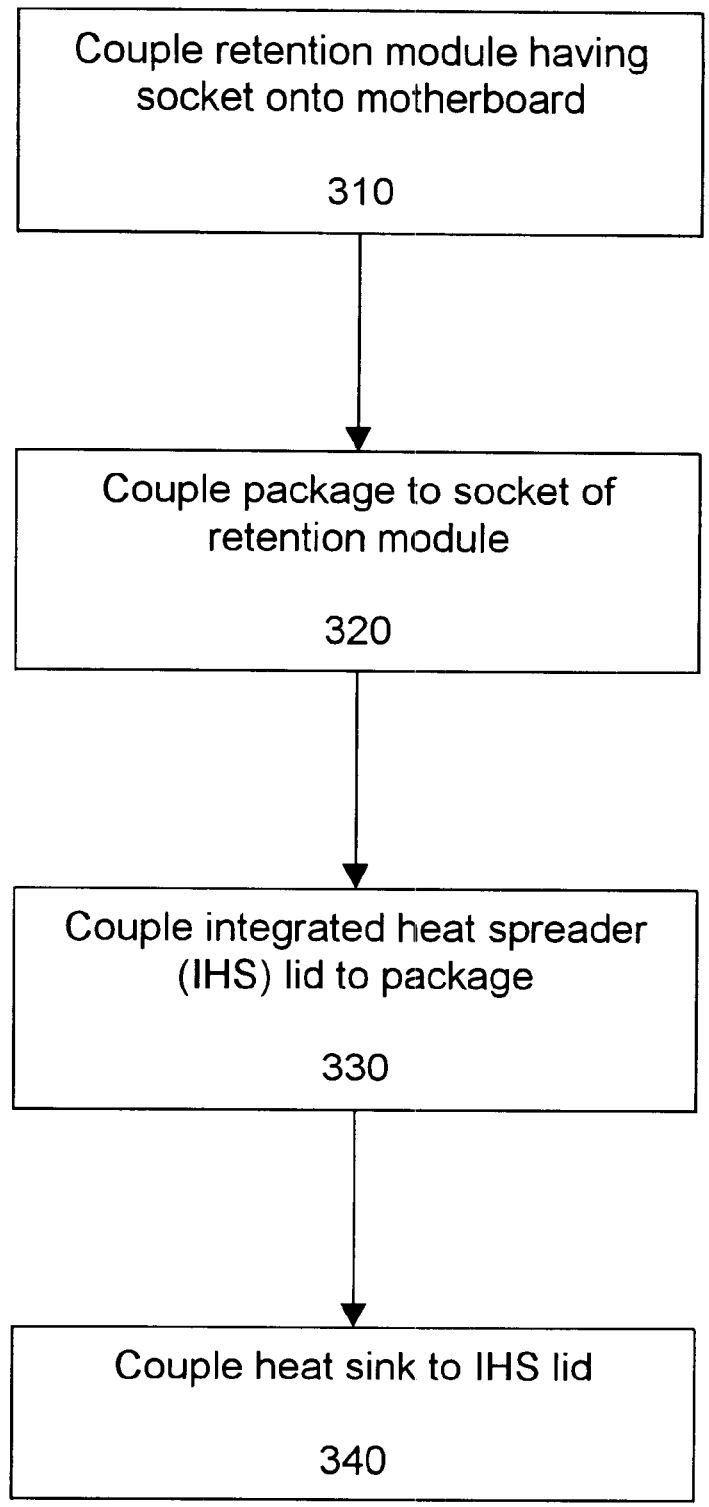
FIG. 3 illustrates a flow chart of retaining a heat sink to a package according to an embodiment of the present invention.

FIG. 3 illustrates a flow chart for a method of retaining a heat sink to a package according to an embodiment of the present invention. Within the method, a retention module 100 having a socket 130 is coupled 310 onto a motherboard 150. A package 230 is coupled 320 to the socket 130 of the retention module 100. An integrated heat spreader (IHS) lid 220 is coupled 330 to the package 230. A heat sink 210 is coupled 340 to the IHS lid 220. According to the embodiment as illustrated in FIG. 2, the retention module 100 secures onto a heat sink 210, a package 230 surface, and/or an IHS lid 220 surface by an engagement fit.

Figure 4:
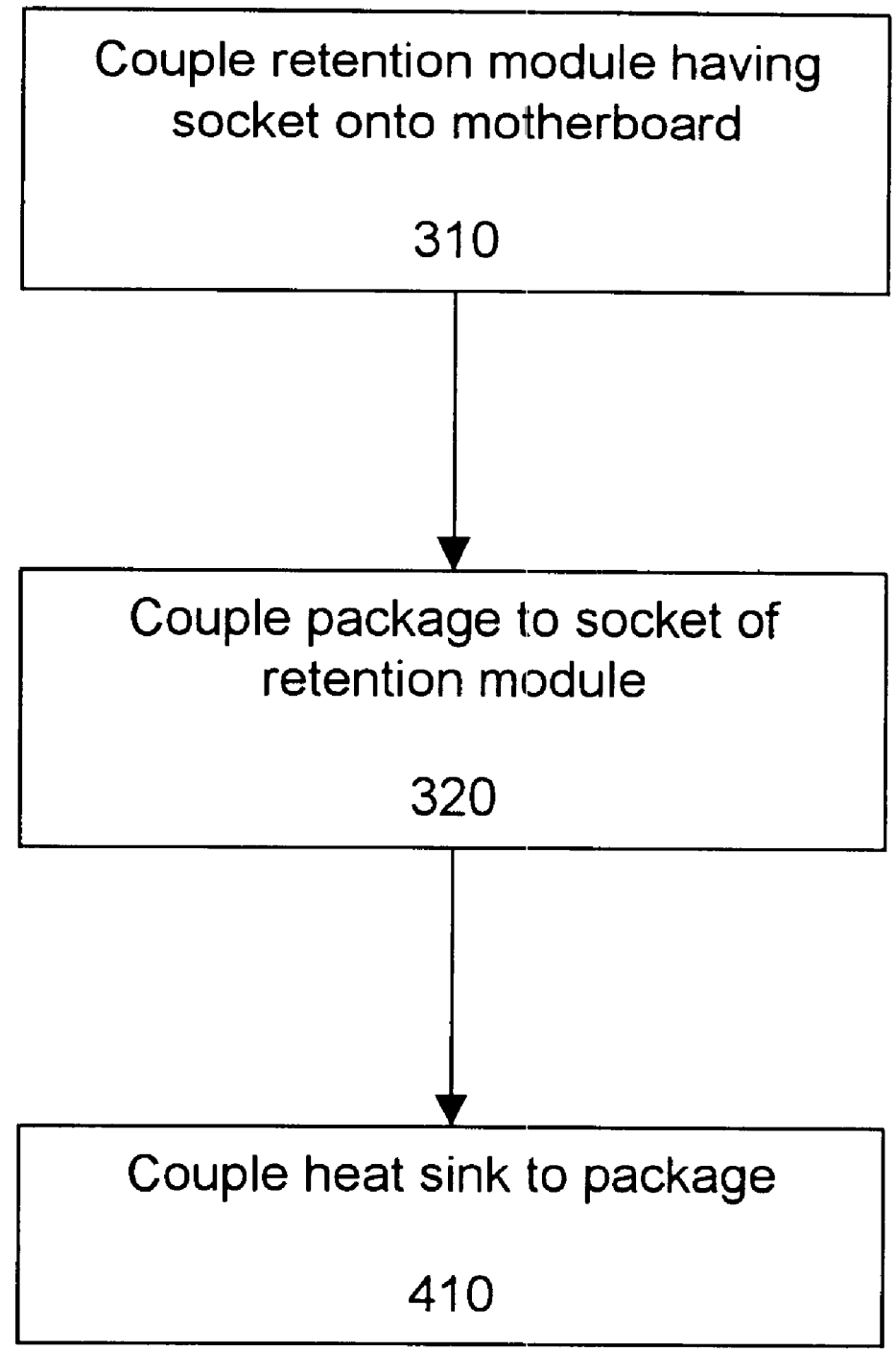
FIG. 4 illustrates a flow chart of retaining a heat sink to a package according to another embodiment of the present invention.

FIG. 4 illustrates a flow chart for a method of retaining a heat sink to a package according to another embodiment of the present invention. Within the method, a retention module 100 having a socket 130 is coupled 310 onto a motherboard 150. A package 230 is coupled 320 to the socket 130 of the retention module 100. A heat sink 210 is coupled 410 to the package 230. According to the embodiment as illustrated in FIG. 2, the retention module 100 secures onto a heat sink 210 or a package 230 surface by an engagement fit.

In summary, the retention module 100 according to the present invention eliminates motherboard holes. This configuration reduces the amount of space consumed on the motherboard 150, thereby reducing the price of the motherboard 150. Furthermore, attaching the retention module(s) 100 to the socket 130, or incorporating the retention module (s) 100 and the socket 130 into a unitary member, mitigates inventory issues and decreases both the cost of the package system 200 and the number of piece parts. The retention module 100 also simplifies field assembly and disassembly. Finally, the spring force of the retention arm(s) 120 of FIGS. 1, 2, for example, may be modulated by modifying the curve and thickness of the retention arm(s) 120.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A retention module, comprising:
   a socket connected to a package;
   a first independent retention arm coupled to a first side of the socket;
   a second independent retention arm coupled to a second side of the socket, wherein the first independent retention arm and the second independent retention arm do not contact each other, and wherein when the retention module is actively securing a heat sink to the package, the first independent retention arm and the second independent retention arm are substantially perpendicular to the plane at which the socket is connected to the package;
   a first independent clamping bar coupled to the first independent retention arm, wherein the first independent clamping bar actively secures the heat sink to the package by clamping a first top edge of the heat sink at a location where the top edge of the heat sink meets a first sidewall of the heat sink; and
   a second independent clamping bar coupled to the second independent retention arm, wherein the second independent clamping bar actively secures the heat sink to the package by clamping a second top edge of the heat sink at a location where the top edge of the heat sink meets a second sidewall of the heat sink, and the first independent clamping bar and the second independent clamping bar do not contact each other.

2. The retention module according to claim 1, wherein the first retention arm and the second opposing retention arm are rotatably affixed to the socket.

3. The retention module according to claim 1, wherein the socket connects to a motherboard.

4. The retention module according to claim 1, wherein the first retention arm and the second opposing retention arm include mesh members.

5. The retention module according to claim 1, wherein the first retention arm and the second opposing retention arm are formed of wire.

6. The retention module according to claim 1, wherein the socket is plastic.

7. A retention module, comprising:
   a socket to connect to a package;
   first independent retention arm coupled to a first side of the socket;
   a second independent retention arm coupled to a second side of the socket, wherein the first independent retention arm and the second independent retention arm do not contact each other, and the retention module actively secures a heat sink to the package, the first independent retention arm and the second independent retention arm are substantially perpendicular to the plane at which the socket is connected to the package;
   a first independent clamping bar coupled to the first independent retention arm, wherein the first independent clamping bar actively secures the heat sink to the package by clamping a first top edge of the heat sink at a location where the top edge of the heat sink meets a first sidewall of the heat sink; and
   a second independent clamping bar coupled to the second independent retention arm, wherein the second independent clamping bar actively secures the heat sink to the package by clamping a second top edge of the heat sink at a location where the top edge of the heat sink meets a second sidewall of the heat sink, the first independent clamping bar and the second independent clamping bar do not contact each other, and
   when the retention module is actively securing the heat sink to the package, the first independent retention arm and the second independent retention arm are substantially perpendicular to the plane at which the socket is connected to the package, and
   the first independent retention arm extends a first distance less than 50% of a first length of a surface of the socket, the surface of the socket being the surface to which the package is connected, and the first length being a distance from an edge of the surface of the socket nearest a point at which the first independent retention arm couples to the socket and extends to an edge on an opposite side of the socket,
   and the second independent retention arm extends a second distance less than 50% of a second length of the surface of the socket, the surface of the socket being the surface to which the package is connected, and the second length being a distance from an edge of the surface of the socket nearest a point at which the second independent retention arm couples to the socket and extends to an edge on an opposite side of the socket.

8. The retention module according to claim 7, wherein the first independent retention arm and the second independent retention arm are rotatably affixed to the socket.

9. The retention module according to claim 7, wherein the socket connects to a motherboard.

10. The retention module in to claim 7, wherein the first independent retention arm and the second independent retention arm include mesh members.

11. The retention module according to claim 7, wherein the first independent retention arm and the second independent retention arm are formed of wire.

12. The retention module according to claim 7, wherein the socket is plastic.

* * * * *